(12) United States Patent
Hamelin et al.

(10) Patent No.: US 7,079,760 B2
(45) Date of Patent: Jul. 18, 2006

(54) PROCESSING SYSTEM AND METHOD FOR THERMALLY TREATING A SUBSTRATE

(75) Inventors: Thomas Hamelin, Georgetown, MA (US); Jay Wallace, Danvers, MA (US); Arthur Laflamme, Jr., Rowley, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/704,969

(22) Filed: Nov. 12, 2003

(65) Prior Publication Data
US 2004/0184792 A1 Sep. 23, 2004

Related U.S. Application Data

(60) Provisional application No. 60/454,641, filed on Mar. 17, 2003.

(51) Int. Cl.
*F26B 19/00* (2006.01)

(52) U.S. Cl. ............. 392/416; 392/418; 219/390; 219/405; 219/411; 118/724; 118/725; 118/50.1

(58) Field of Classification Search .......... 219/390, 219/405, 411; 118/724, 725, 50.1, 728–730; 372/416, 418
See application file for complete search history.

(56) References Cited

U.S. PATENT DOCUMENTS

| 5,282,925 | A | 2/1994 | Jeng et al. |
|---|---|---|---|
| 5,838,055 | A | 11/1998 | Kleinhenz et al. |
| 5,876,879 | A | 3/1999 | Kleinhenz et al. |
| 6,071,815 | A | 6/2000 | Kleinhenz et al. |
| 6,074,951 | A | 6/2000 | Kleinhenz et al. |
| 6,245,619 | B1 | 6/2001 | Boyd et al. |
| 6,271,094 | B1 | 8/2001 | Boyd et al. |
| 6,310,755 | B1 | 10/2001 | Kholodenko et al. |
| 6,335,261 | B1 | 1/2002 | Natzle et al. |
| 6,515,261 | B1 * | 2/2003 | Smargiassi et al. ......... 219/390 |
| 6,544,380 | B1 * | 4/2003 | Tomoyasu et al. ..... 156/345.51 |
| 6,616,767 | B1 * | 9/2003 | Zhao et al. ............ 219/121.52 |
| 2001/0016226 | A1 | 8/2001 | Natzle et al. |
| 2002/0028555 | A1 | 3/2002 | Boyd et al. |
| 2002/0063110 | A1 | 5/2002 | Cantell et al. |
| 2002/0189757 | A1 | 12/2002 | Denton et al. |

FOREIGN PATENT DOCUMENTS

WO  WO 01/01460 A2  1/2001

* cited by examiner

*Primary Examiner*—Shawntina Fuqua

(74) *Attorney, Agent, or Firm*—Pillsbury Winthrop Shaw Pittman LLP

(57) ABSTRACT

A processing system for thermally treating a substrate including a temperature controlled thermal treatment chamber and a temperature controlled substrate holder for supporting a substrate for thermal treatment. The substrate holder is thermally insulated from the thermal treatment chamber. A method for thermally treating a substrate is also provided.

28 Claims, 17 Drawing Sheets

PROCESSING SYSTEM AND METHOD FOR THERMALLY TREATING A SUBSTRATE

This non-provisional application claims the benefit of U.S. Provisional Application No. 60/454,641, which was filed on Mar. 17, 2003, the content of which is hereby incorporated in its entirety.

CROSS-REFERENCE TO RELATED APPLICATIONS

Cross-Reference to Related Applications

This application is related to co-pending U.S. patent application Ser. No. 10/705,201, entitled "Processing System and Method for Treating a Substrate", filed on Nov. 12, 2003; co-pending U.S. patent application Ser. No. 10/705,200, entitled "Processing System and Method for Chemically Treating a Substrate", filed on Nov. 12, 2003; and co-pending U.S. patent application Ser. No. 10/705,397, entitled "Method and Apparatus for Thermally Insulating Adjacent Temperature Controlled Chambers", filed on Nov. 12, 2003. The entire contents of all of those applications are herein incorporated by reference in their entirety.

FIELD OF THE INVENTION

The present invention relates to a system and method for thermal treatment of a substrate.

BACKGROUND OF THE INVENTION

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, gates, etc.) in the selected regions of the substrate. Such substrate materials where etching is required include silicon dioxide ($SiO_2$), low-k dielectric materials, poly-silicon, and silicon nitride. During material processing, etching such features generally comprises the transfer of a pattern formed within a mask layer to the underlying film within which the respective features are formed. The mask can, for example, comprise a light-sensitive material such as (negative or positive) photo-resist, multiple layers including such layers as photo-resist and an anti-reflective coating (ARC), or a hard mask formed from the transfer of a pattern in a first layer, such as photo-resist, to the underlying hard mask layer.

SUMMARY OF THE INVENTION

The present invention relates to a system and method for thermally treating a substrate.

In one aspect of the invention, a processing system is described for thermally treating a substrate. The processing system comprises a thermal treatment system, wherein the thermal treatment system comprises a temperature controlled thermal treatment chamber, a temperature controlled substrate holder mounted within the thermal treatment chamber and configured to be substantially thermally insulated from the thermal treatment chamber, and a vacuum pumping system coupled to the thermal treatment chamber.

Additionally, a method of operating the processing system to thermally treat a substrate is described. The method comprises transferring the substrate into the thermal treatment system; setting one or more thermal processing parameters for the thermal treatment system, wherein the one or more thermal processing parameters comprise at least one of a thermal treatment processing pressure, a thermal treatment chamber temperature, a thermal treatment substrate temperature, a thermal treatment substrate holder temperature, and a thermal treatment gas flow rate; and processing the substrate in the thermal treatment system using the one or more thermal processing parameters.

DETAILED DESCRIPTION OF SEVERAL EMBODIMENTS

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing including silicon dioxide ($SiO_2$), silicon nitride ($Si_3N_4$), and carbon, for example.

In order to reduce the feature size formed in the thin film, the hard mask can be trimmed laterally using, for example, a two-step process involving a chemical treatment of the exposed surfaces of the hard mask layer in order to alter the surface chemistry of the hard mask layer, and a post treatment of the exposed surfaces of the hard mask layer in order to desorb the altered surface chemistry.

Figure 1A:
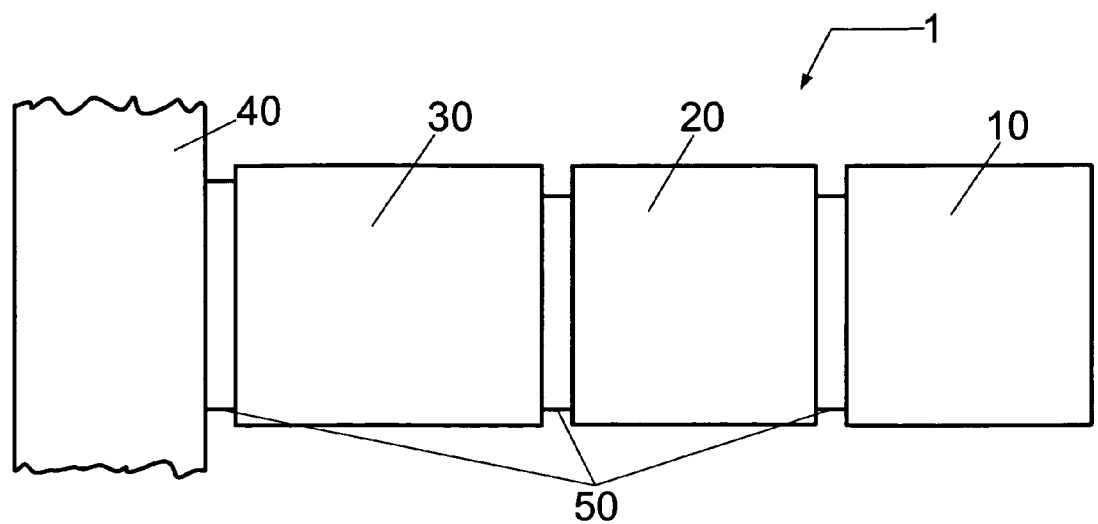
FIG. 1A illustrates a schematic representation of a transfer system for a chemical treatment system and a thermal treatment system according to an embodiment of the present invention.

According to one embodiment, FIG. 1A presents a processing system 1 for processing a substrate using, for example, mask layer trimming. The processing system 1 comprises a first treatment system 10, and a second treatment system 20 coupled to the first treatment system 10. For example, the first treatment system 10 can comprise a chemical treatment system, and the second treatment system 20 can comprise a thermal treatment system. Alternately, the second treatment system 20 can comprise a substrate rinsing system, such as a water rinsing system. Also, as illustrated in FIG. 1A, a transfer system 30 can be coupled to the first treatment system 10 in order to transfer substrates into and out of the first treatment system 10 and the second treatment system 20, and exchange substrates with a multi-element manufacturing system 40. The first and second treatment systems 10, 20, and the transfer system 30 can, for example, comprise a processing element within the multi-element manufacturing system 40. For example, the multi-element manufacturing system 40 can permit the transfer of substrates to and from processing elements including such devices as etch systems, deposition systems, coating systems, patterning systems, metrology systems, etc. In order to isolate the processes occurring in the first and second systems, an isolation assembly 50 can be utilized to couple each system. For instance, the isolation assembly 50 can comprise at least one of a thermal insulation assembly to provide thermal isolation, and a gate valve assembly to provide vacuum isolation. Of course, treatment systems 10 and 20, and transfer system 30 can be placed in any sequence.

Figure 1B:
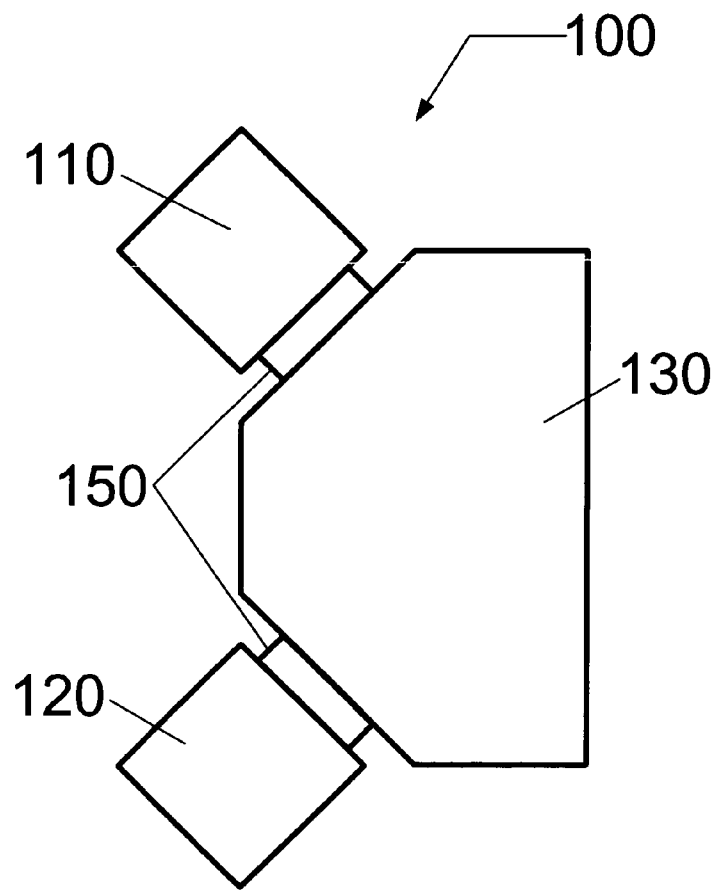
FIG. 1B illustrates a schematic representation of a transfer system for a chemical treatment system and a thermal treatment system according to another embodiment of the present invention.

Alternately, in another embodiment, FIG. 1B presents a processing system 100 for processing a substrate using a process such as mask layer trimming. The processing system 100 comprises a first treatment system 110, and a second treatment system 120. For example, the first treatment system 110 can comprise a chemical treatment system, and the second treatment system 120 can comprise a thermal treatment system. Alternately, the second treatment system 120 can comprise a substrate rinsing system, such as a water rinsing system. Also, as illustrated in FIG. 1B, a transfer system 130 can be coupled to the first treatment system 110 in order to transfer substrates into and out of the first treatment system 110, and can be coupled to the second treatment system 120 in order to transfer substrates into and out of the second treatment system 120. Additionally, transfer system 130 can exchange substrates with one or more substrate cassettes (not shown). Although only two process systems are illustrated in FIG. 1B, other process systems can access transfer system 130 including such devices as etch systems, deposition systems, coating systems, patterning systems, metrology systems, etc. In order to isolate the processes occurring in the first and second systems, an isolation assembly 150 can be utilized to couple each system. For instance, the isolation assembly 150 can comprise at least one of a thermal insulation assembly to provide thermal isolation, and a gate valve assembly to provide vacuum isolation. Additionally, for example, the transfer system 130 can serve as part of the isolation assembly 150.

Figure 1C:
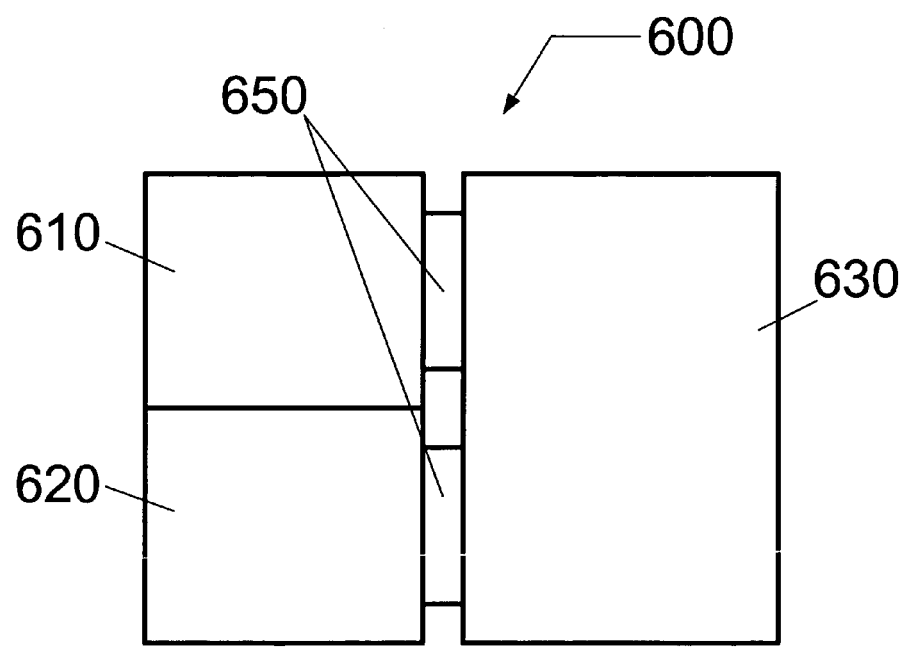
FIG. 1C illustrates a schematic representation of a processing system according to another embodiment of the present invention.

Alternately, in another embodiment, FIG. 1C presents a processing system 600 for processing a substrate using a process such as mask layer trimming. The processing system 600 comprises a first treatment system 610, and a second treatment system 620, wherein the first treatment system 610 is stacked atop the second treatment system 620 in a vertical direction as shown. For example, the first treatment system 610 can comprise a chemical treatment system, and the second treatment system 620 can comprise a thermal treatment system. Alternately, the second treatment system 620 can comprise a substrate rinsing system, such as a water rinsing system. Also, as illustrated in FIG. 1C, a transfer system 630 can be coupled to the first treatment system 610 in order to transfer substrates into and out of the first treatment system 610, and can be coupled to the second treatment system 620 in order to transfer substrates into and out of the second treatment system 620. Additionally, transfer system 630 can exchange substrates with one or more substrate cassettes (not shown). Although only two process systems are illustrated in FIG. 1C, other process systems can access transfer system 630 including such devices as etch systems, deposition systems, coating systems, patterning systems, metrology systems, etc. In order to isolate the processes occurring in the first and second systems, an isolation assembly 650 can be utilized to couple each system. For instance, the isolation assembly 650 can comprise at least one of a thermal insulation assembly to provide thermal isolation, and a gate valve assembly to provide vacuum isolation. Additionally, for example, the transfer system 630 can serve as part of the isolation assembly 650.

In general, at least one of the first treatment system 10 and the second treatment system 20 of the processing system 1 depicted in FIG. 1A comprises at least two transfer openings to permit the passage of the substrate therethrough. For example, as depicted in FIG. 1A, the first treatment system 10 comprises two transfer openings, the first transfer opening permits the passage of the substrate between the first treatment system 10 and the transfer system 30 and the second transfer opening permits the passage of the substrate between the first treatment system and the second treatment system. However, regarding the processing system 100 depicted in FIG. 1B and the processing system 600 depicted in FIG. 1C, each treatment system 110, 120 and 610, 620, respectively, comprises at least one transfer opening to permit the passage of the substrate therethrough.

Figure 2:
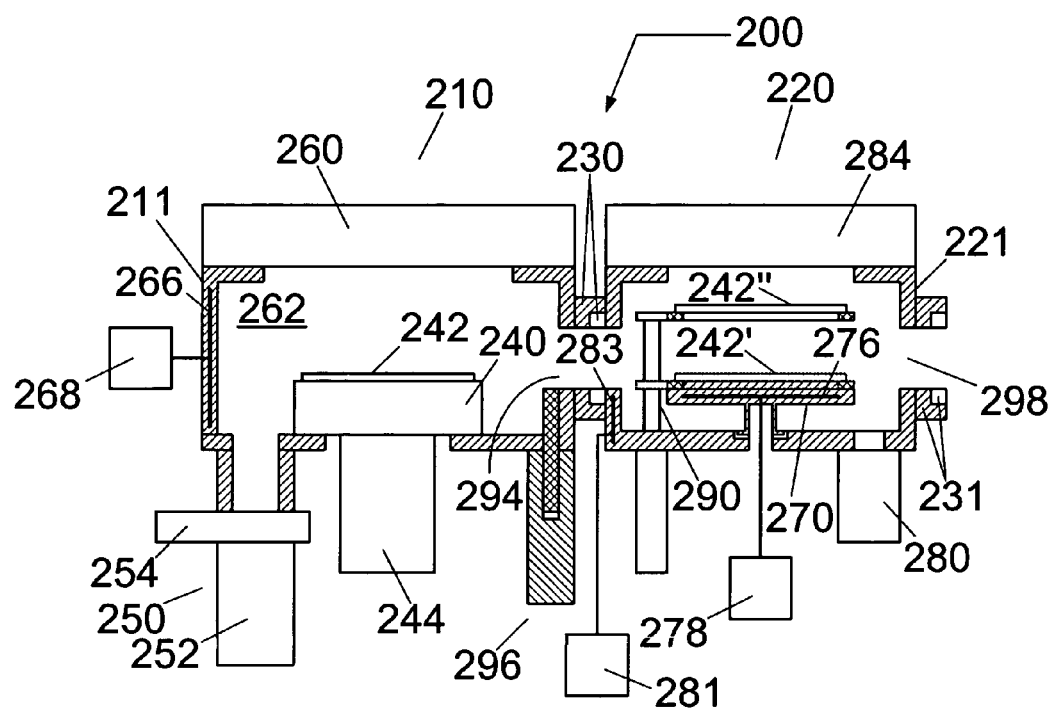
FIG. 2 shows a schematic cross-sectional view of a processing system according to an embodiment of the present invention.

Referring now to FIG. 2, a processing system 200 for performing chemical treatment and thermal treatment of a substrate is presented. Processing system 200 comprises a chemical treatment system 210, and a thermal treatment system 220 coupled to the chemical treatment system 210. The chemical treatment system 210 comprises a chemical treatment chamber 211, which can be temperature-controlled. The thermal treatment system 220 comprises a thermal treatment chamber 221, which can be temperature-controlled. The chemical treatment chamber 211 and the thermal treatment chamber 221 can be thermally insulated from one another using a thermal insulation assembly 230, and vacuum isolated from one another using a gate valve assembly 296, to be described in greater detail below.

Figure 3:
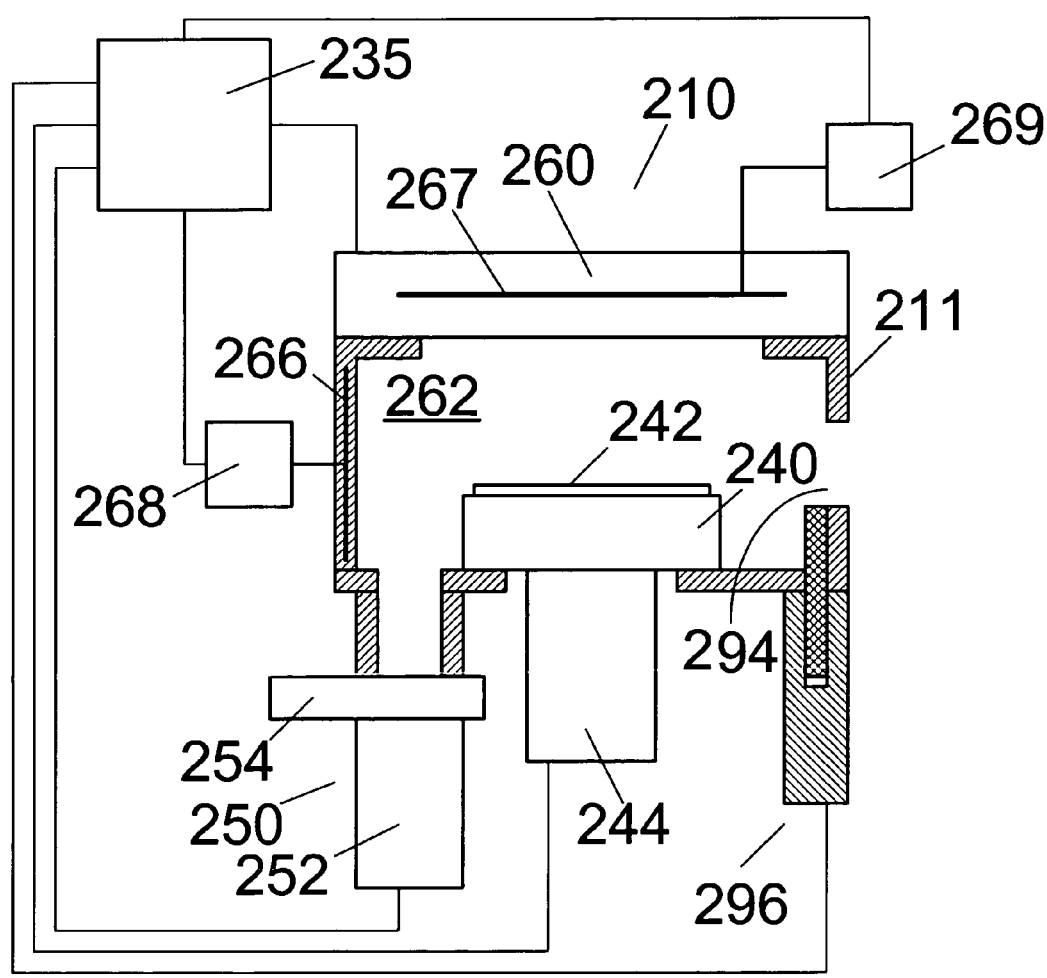
FIG. 3 shows a schematic cross-sectional view of a chemical treatment system according to an embodiment of the present invention.

As illustrated in FIGS. 2 and 3, the chemical treatment system 210 further comprises a temperature controlled substrate holder 240 configured to be substantially thermally isolated from the chemical treatment chamber 211 and configured to support a substrate 242, a vacuum pumping system 250 coupled to the chemical treatment chamber 211 to evacuate the chemical treatment chamber 211, and a gas distribution system 260 for introducing a process gas into a process space 262 within the chemical treatment chamber 211.

Figure 5:
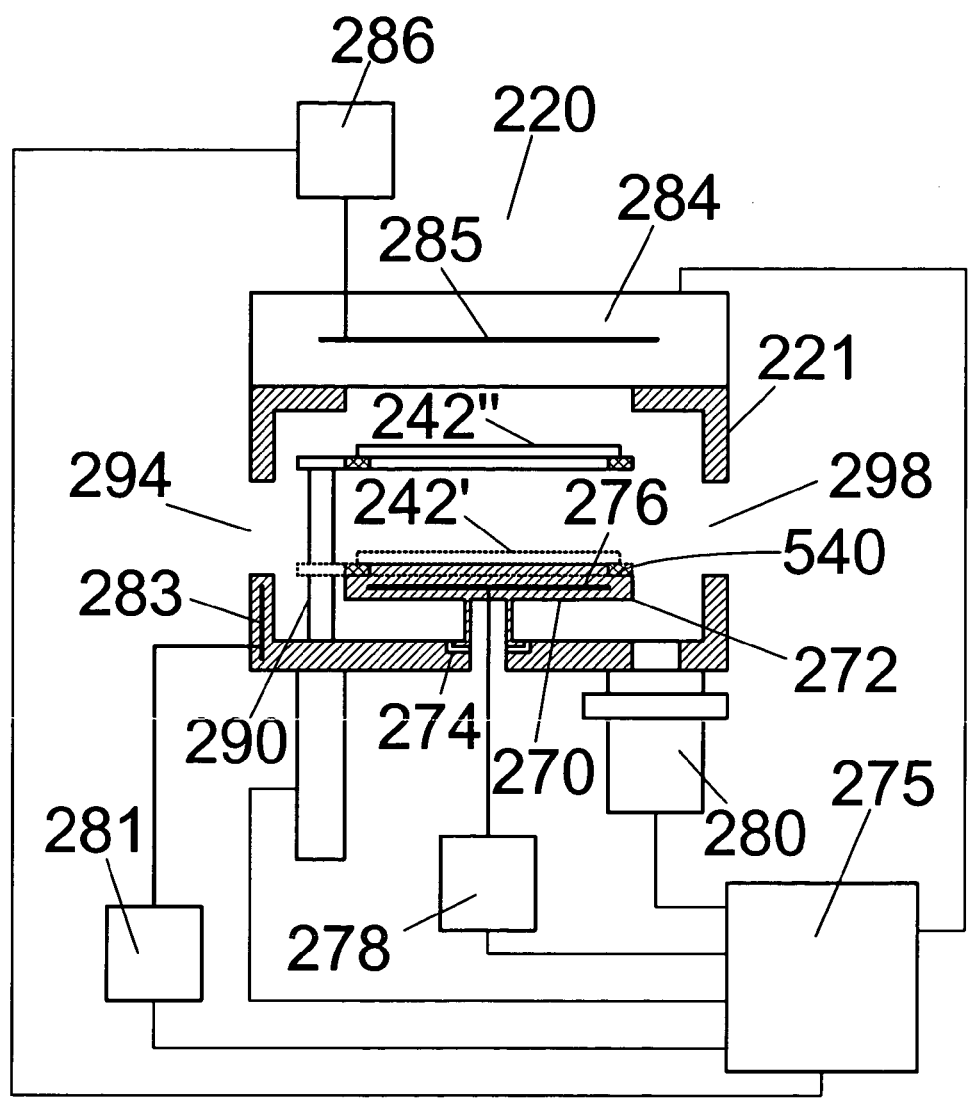
FIG. 5 shows a schematic cross-sectional view of a thermal treatment system according to an embodiment of the present invention.

As illustrated in FIGS. 2 and 5, the thermal treatment system 220 further comprises a temperature controlled substrate holder 270 mounted within the thermal treatment chamber 221 and configured to be substantially thermally insulated from the thermal treatment chamber 221 and configured to support a substrate 242', a vacuum pumping system 280 to evacuate the thermal treatment chamber 221, and a substrate lifter assembly 290 coupled to the thermal treatment chamber 221. Lifter assembly 290 can vertically translate the substrate 242" between a holding plane (solid lines) and the substrate holder 270 (dashed lines), or a transfer plane located therebetween. The thermal treatment chamber 221 can further comprise an upper assembly 284.

Additionally, the chemical treatment chamber 211, thermal treatment chamber 221, and thermal insulation assembly 230 define a common opening 294 through which a substrate can be transferred. During processing, the common opening 294 can be sealed closed using a gate valve assembly 296 in order to permit independent processing in the two chambers 211, 221. Furthermore, a transfer opening 298 can be formed in the thermal treatment chamber 221 in order to permit substrate exchanges with a transfer system as illustrated in FIG. 1A. For example, a second thermal insulation assembly 231 can be implemented to thermally insulate the thermal treatment chamber 221 from a transfer system (not shown). Although the opening 298 is illustrated as part of the thermal treatment chamber 221 (consistent with FIG. 1A), the transfer opening 298 can be formed in the chemical treatment chamber 211 and not the thermal treatment chamber 221 (reverse chamber positions as shown in FIG. 1A), or the transfer opening 298 can be formed in both the chemical treatment chamber 211 and the thermal treatment chamber 221 (as shown in FIGS. 1B and 1C).

As illustrated in FIGS. 2 and 3, the chemical treatment system 210 comprises a substrate holder 240, and a substrate holder assembly 244 in order to provide several operational functions for thermally controlling and processing substrate 242. The substrate holder 240 and substrate holder assembly 244 can comprise an electrostatic clamping system (or mechanical clamping system) in order to electrically (or mechanically) clamp substrate 242 to the substrate holder 240. Furthermore, substrate holder 240 can, for example, further include a cooling system having a re-circulating coolant flow that receives heat from substrate holder 240 and transfers heat to a heat exchanger system (not shown), or when heating, transfers heat from the heat exchanger system. Moreover, a heat transfer gas can, for example, be delivered to the back-side of substrate 242 via a backside gas system to improve the gas-gap thermal conductance between substrate 242 and substrate holder 240. For instance, the heat transfer gas supplied to the back-side of substrate 242 can comprise an inert gas such as helium, argon, xenon, krypton, a process gas, or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the back-side gas gap pressure can be independently varied between the center and the edge of substrate 242. In other embodiments, heating/cooling elements, such as resistive heating elements, or thermo-electric heaters/coolers can be included in the substrate holder 240, as well as the chamber wall of the chemical treatment chamber 211.

Figure 7:
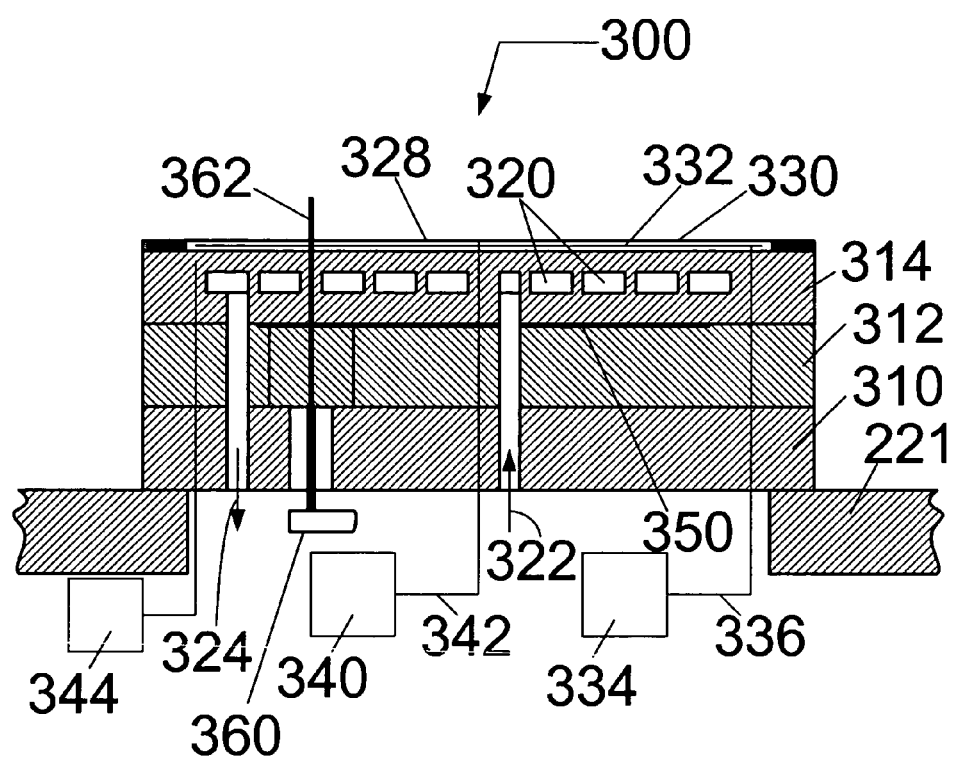
FIG. 7 illustrates a schematic cross-sectional view of a substrate holder according to an embodiment of the present invention.

For example, FIG. 7 presents a temperature controlled substrate holder 300 for performing several of the above-identified functions. Substrate holder 300 comprises a chamber mating component 310 coupled to a lower wall of the chemical treatment chamber 211, an insulating component 312 coupled to the chamber mating component 310, and a temperature control component 314 coupled to the insulating component 312. The chamber mating and temperature control components 310, 314 can, for example, be fabricated from an electrically and thermally conducting material such as aluminum, stainless steel, nickel, etc. The insulating component 312 can, for example, be fabricated from a thermally-resistant material having a relatively lower thermal conductivity such as quartz, alumina, Teflon, etc.

The temperature control component 314 can comprise temperature control elements such as cooling channels, heating channels, resistive heating elements, or thermoelectric elements. For example, as illustrated in FIG. 7, the temperature control component 314 comprises a coolant channel 320 having a coolant inlet 322 and a coolant outlet 324. The coolant channel 320 can, for example, be a spiral passage within the temperature control component 314 that permits a flow rate of coolant, such as water, Fluorinert, Galden HT-135, etc., in order to provide conductive-convective cooling of the temperature control component 314. Alternately, the temperature control component 314 can comprise an array of thermoelectric elements capable of heating or cooling a substrate depending upon the direction of electrical current flow through the respective elements.

An exemplary thermo-electric element is one commercially available from Advanced Thermoelectric, Model ST-127-1.4-8.5M (a 40 mm by 40 mm by 3.4 mm thermoelectric device capable of a maximum heat transfer power of 72 W).

Additionally, the substrate holder 300 can further comprise an electrostatic clamp (ESC) 328 comprising a ceramic layer 330, a clamping electrode 332 embedded therein, and a high-voltage (HV) DC voltage supply 334 coupled to the clamping electrode 332 using an electrical connection 336. The ESC 328 can, for example, be mono-polar, or bi-polar. The design and implementation of such a clamp is well known to those skilled in the art of electrostatic clamping systems.

Additionally, the substrate holder 300 can further comprise a back-side gas supply system 340 for supplying a heat transfer gas, such as an inert gas including helium, argon, xenon, krypton, a process gas, or other gas including oxygen, nitrogen, or hydrogen, to the backside of substrate 242 through at least one gas supply line 342, and at least one of a plurality of orifices and channels. The backside gas supply system 340 can, for example, be a multi-zone supply system such as a two-zone (center-edge) system, wherein the backside pressure can be varied radially from the center to edge.

The insulating component 312 can further comprise a thermal insulation gap 350 in order to provide additional thermal insulation between the temperature control component 314 and the underlying mating component 310. The thermal insulation gap 350 can be evacuated using a pumping system (not shown) or a vacuum line as part of vacuum pumping system 250, and/or coupled to a gas supply (not shown) in order to vary its thermal conductivity. The gas supply can, for example, be the backside gas supply 340 utilized to couple heat transfer gas to the back-side of the substrate 242.

The mating component 310 can further comprise a lift pin assembly 360 capable of raising and lowering three or more lift pins 362 in order to vertically translate substrate 242 to and from an upper surface of the substrate holder 300 and a transfer plane in the processing system.

Each component 310, 312, and 314 further comprises fastening devices (such as bolts and tapped holes) in order to affix one component to another, and to affix the substrate holder 300 to the chemical treatment chamber 211. Furthermore, each component 310, 312, and 314 facilitates the passage of the above-described utilities to the respective component, and vacuum seals, such as elastomer O-rings, are utilized where necessary to preserve the vacuum integrity of the processing system.

The temperature of the temperature-controlled substrate holder 240 can be monitored using a temperature sensing device 344 such as a thermocouple (e.g. a K-type thermocouple, Pt sensor, etc.). Furthermore, a controller can utilize the temperature measurement as feedback to the substrate holder assembly 244 in order to control the temperature of substrate holder 240. For example, at least one of a fluid flow rate, fluid temperature, heat transfer gas type, heat transfer gas pressure, clamping force, resistive heater element current or voltage, thermoelectric device current or polarity, etc. can be adjusted in order to affect a change in the temperature of substrate holder 240 and/or the temperature of the substrate 242.

Figure 8:
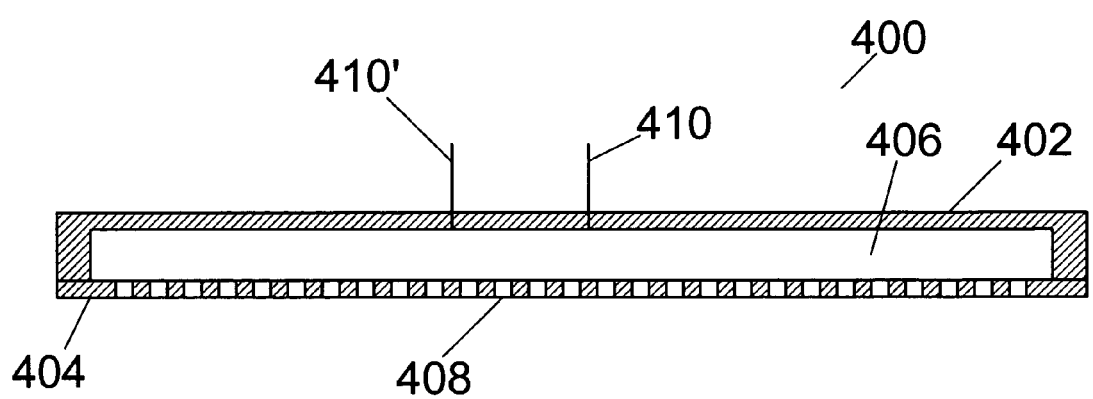
FIG. 8 illustrates a schematic cross-sectional view of a gas distribution system according to an embodiment of the present invention.

Referring again to FIGS. 2 and 3, chemical treatment system 210 comprises a gas distribution system 260. In one embodiment, as shown in FIG. 8, a gas distribution system 400 comprises a showerhead gas injection system having a gas distribution assembly 402, and a gas distribution plate 404 coupled to the gas distribution assembly 402 and configured to form a gas distribution plenum 406. Although not shown, gas distribution plenum 406 can comprise one or more gas distribution baffle plates. The gas distribution plate 404 further comprises one or more gas distribution orifices 408 to distribute a process gas from the gas distribution plenum 406 to the process space within chemical treatment chamber 211. Additionally, one or more gas supply lines 410, 410', etc. can be coupled to the gas distribution plenum 406 through, for example, the gas distribution assembly in order to supply a process gas comprising one or more gases. The process gas can, for example, comprise $NH_3$, HF, $H_2$, $O_2$, CO, $CO_2$, Ar, He, etc.

Figure 9A:
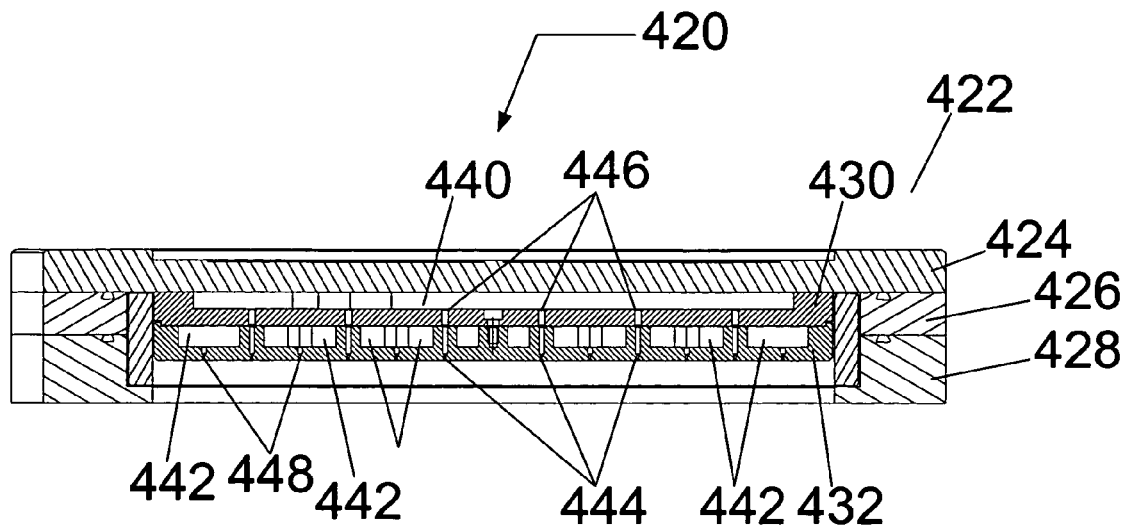
FIG. 9A illustrates a schematic cross-sectional view of a gas distribution system according to another embodiment of the present invention.
Figure 9B:
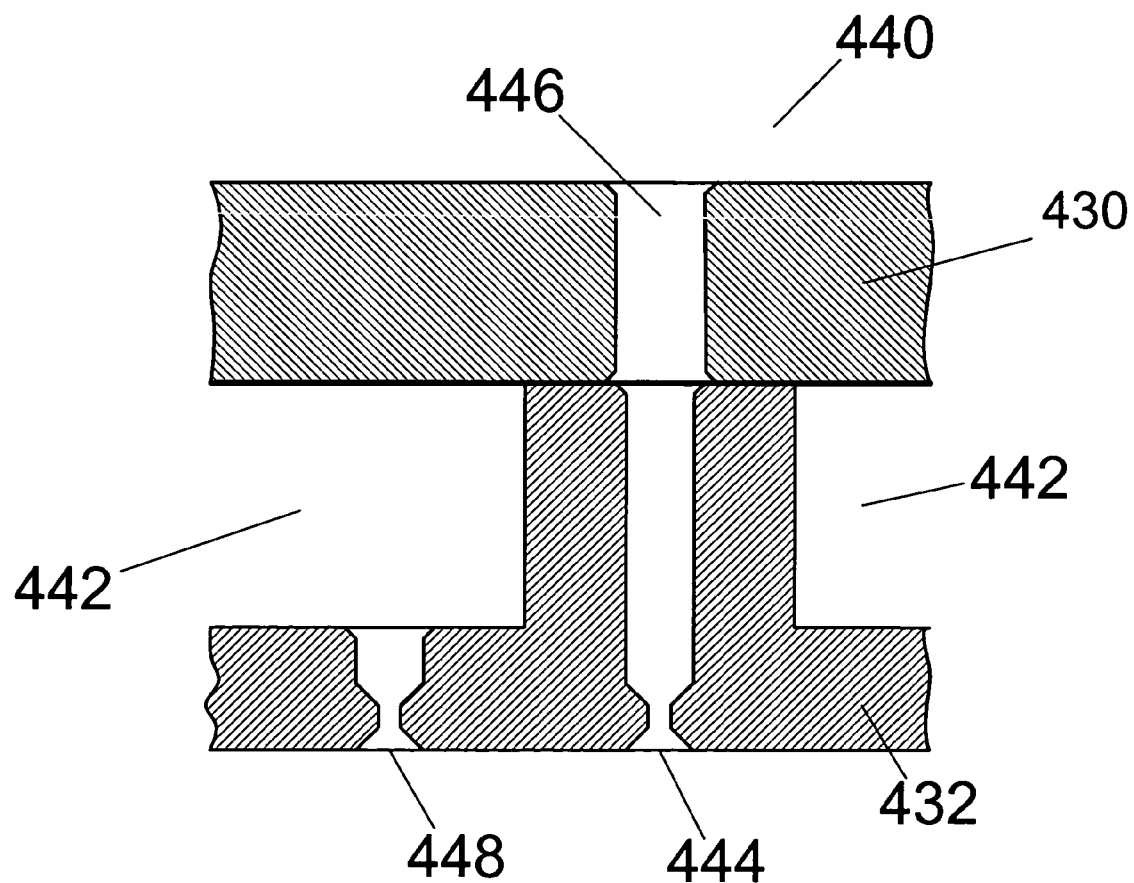
FIG. 9B presents an expanded view of the gas distribution system shown in FIG. 9A according to an embodiment of the present invention.

In another embodiment, as shown in FIGS. 9A and 9B (expanded view of FIG. 9A), a gas distribution system 420 for distributing a process gas comprising at least two gases comprises a gas distribution assembly 422 having one or more components 424, 426, and 428, a first gas distribution plate 430 coupled to the gas distribution assembly 422 and configured to couple a first gas to the process space of chemical treatment chamber 211, and a second gas distribution plate 432 coupled to the first gas distribution plate 430 and configured to couple a second gas to the process space of chemical treatment chamber 211. The first gas distribution plate 430, when coupled to the gas distribution assembly 422, forms a first gas distribution plenum 440. Additionally, the second gas distribution plate 432, when coupled to the first gas distribution plate 430 forms a second gas distribution plenum 442. Although not shown, gas distribution plenums 440, 442 can comprise one or more gas distribution baffle plates. The second gas distribution plate 432 further comprises a first array of one or more orifices 444 coupled to and coincident with an array of one or more passages 446 formed within the first gas distribution plate 430, and a second array of one or more orifices 448. The first array of one or more orifices 444, in conjunction with the array of one or more passages 446, are configured to distribute the first gas from the first gas distribution plenum 440 to the process space of chemical treatment chamber 211. The second array of one or more orifices 448 is configured to distribute the second gas from the second gas distribution plenum 442 to the process space of chemical treatment chamber 211. The process gas can, for example, comprise $NH_3$, HF, $H_2$, $O_2$, CO, $CO_2$, Ar, He, etc. As a result of this arrangement, the first gas and the second gas are independently introduced to the process space without any interaction except in the process space.

Figure 10A:
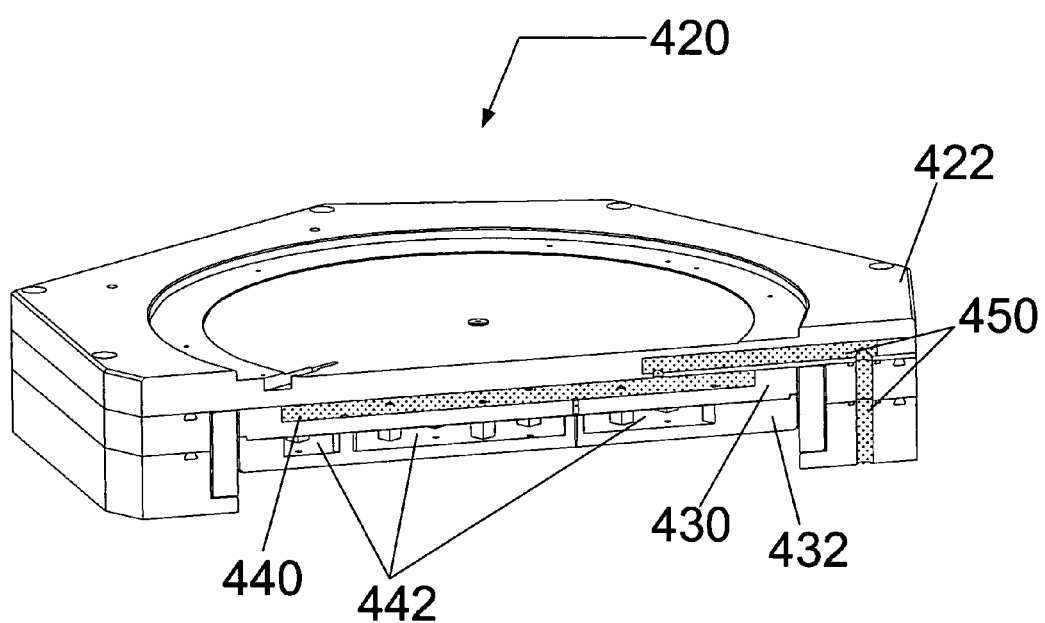
FIGS. 10A and 10B present perspective views of the gas distribution system shown in FIG. 9A according to an embodiment of the present invention.
Figure 10B:
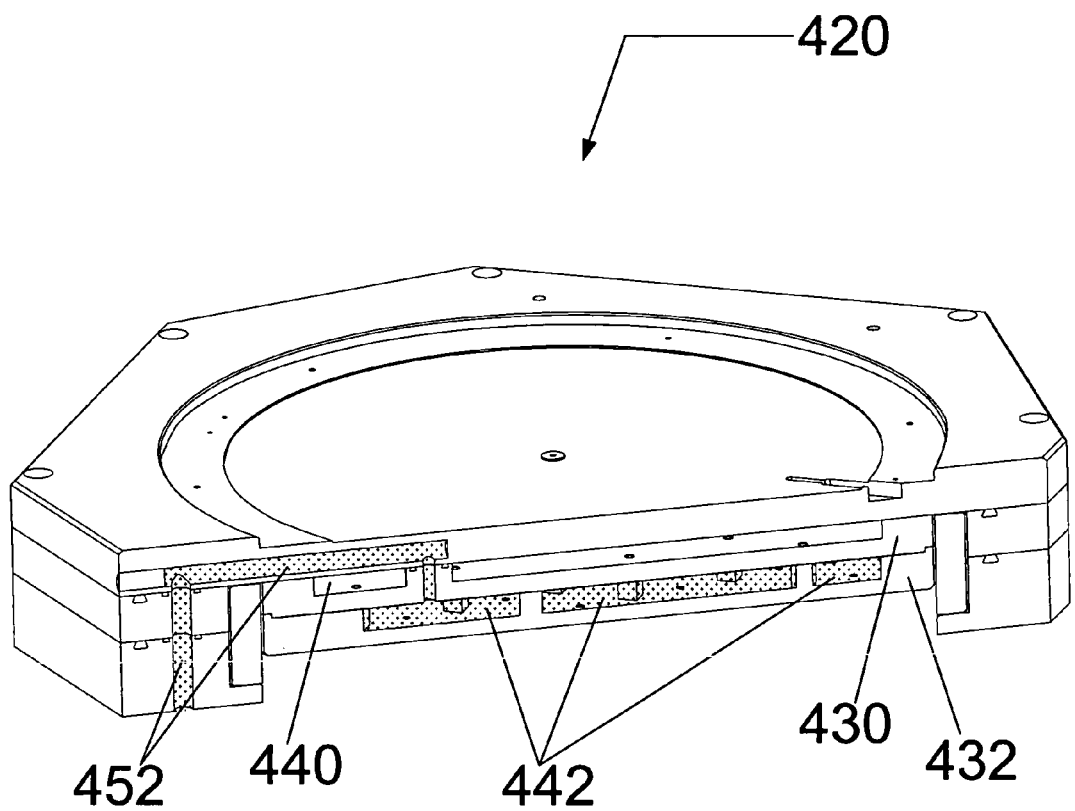

As shown in FIG. 10A, the first gas can be coupled to the first gas distribution plenum 440 through a first gas supply passage 450 formed within the gas distribution assembly 422. Additionally, as shown in FIG. 10B, the second gas can be coupled to the second gas distribution plenum 442 through a second gas supply passage 452 formed within the gas distribution assembly 422.

Referring again to FIGS. 2 and 3, chemical treatment system 220 further comprises a temperature controlled chemical treatment chamber 211 that is maintained at an elevated temperature. For example, a wall heating element 266 can be coupled to a wall temperature control unit 268, and the wall heating element 266 can be configured to couple to the chemical treatment chamber 211. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the wall temperature control unit 268 can, for example, comprise a controllable DC power supply. For example, wall heating element 266 can comprise at least one Firerod cartridge heater commercially available from Watlow (1310 Kingsland Dr., Batavia, Ill., 60510). A cooling element can also be employed in chemical treatment chamber 211. The temperature of the chemical treatment chamber 211 can be monitored using a temperature-sensing device such as a thermocouple (e.g. a K-type thermocouple, Pt sensor, etc.). Furthermore, a controller can utilize the temperature measurement as feedback to the wall temperature control unit 268 in order to control the temperature of the chemical treatment chamber 211.

Referring again to FIG. 3, chemical treatment system 210 can further comprise a temperature controlled gas distribution system 260 that can be maintained at any selected temperature. For example, a gas distribution heating element 267 can be coupled to a gas distribution system temperature control unit 269, and the gas distribution heating element 267 can be configured to couple to the gas distribution system 260. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the gas distribution system temperature control unit 269 can, for example, comprise a controllable DC power supply. For example, gas distribution heating element 267 can comprise a dual-zone silicone rubber heater (about 1.0 mm thick) capable of about 1400 W (or power density of about 5 W/in$^2$). The temperature of the gas distribution system 260 can be monitored using a temperature-sensing device such as a thermocouple (e.g. a K-type thermocouple, Pt sensor, etc.). Furthermore, a controller can utilize the temperature measurement as feedback to the gas distribution system temperature control unit 269 in order to control the temperature of the gas distribution system 260. The gas distribution systems of FIGS. 8–10B can also incorporate a temperature control system. Alternatively, or in addition, cooling elements can be employed in any of the embodiments.

Referring still to FIGS. 2 and 3, vacuum pumping system 250 can comprise a vacuum pump 252 and a gate valve 254 for throttling the chamber pressure. Vacuum pump 252 can, for example, include a turbo-molecular vacuum pump (TMP) capable of a pumping speed up to about 5000 liters per second (and greater). For example, the TMP can be a Seiko STP-A803 vacuum pump, or an Ebara ET1301W vacuum pump. TMPs are useful for low pressure processing, typically less than about 50 mTorr. For high pressure (i.e., greater than about 100 mTorr) or low throughput processing (i.e., no gas flow), a mechanical booster pump and dry roughing pump can be used.

Referring again to FIG. 3, chemical treatment system 210 can further comprise a controller 235 having a microprocessor, memory, and a digital I/O port capable of generating control voltages sufficient to communicate and activate inputs to chemical treatment system 210 as well as monitor outputs from chemical treatment system 210 such as temperature and pressure sensing devices. Moreover, controller 235 can be coupled to and can exchange information with substrate holder assembly 244, gas distribution system 260, vacuum pumping system 250, gate valve assembly 296, wall temperature control unit 268, and gas distribution system temperature control unit 269. For example, a program stored in the memory can be utilized to activate the inputs to the aforementioned components of chemical treatment system 210 according to a process recipe. One example of controller 235 is a DELL PRECISION WORKSTATION 610™, available from Dell Corporation, Austin, Tex.

Figure 4:
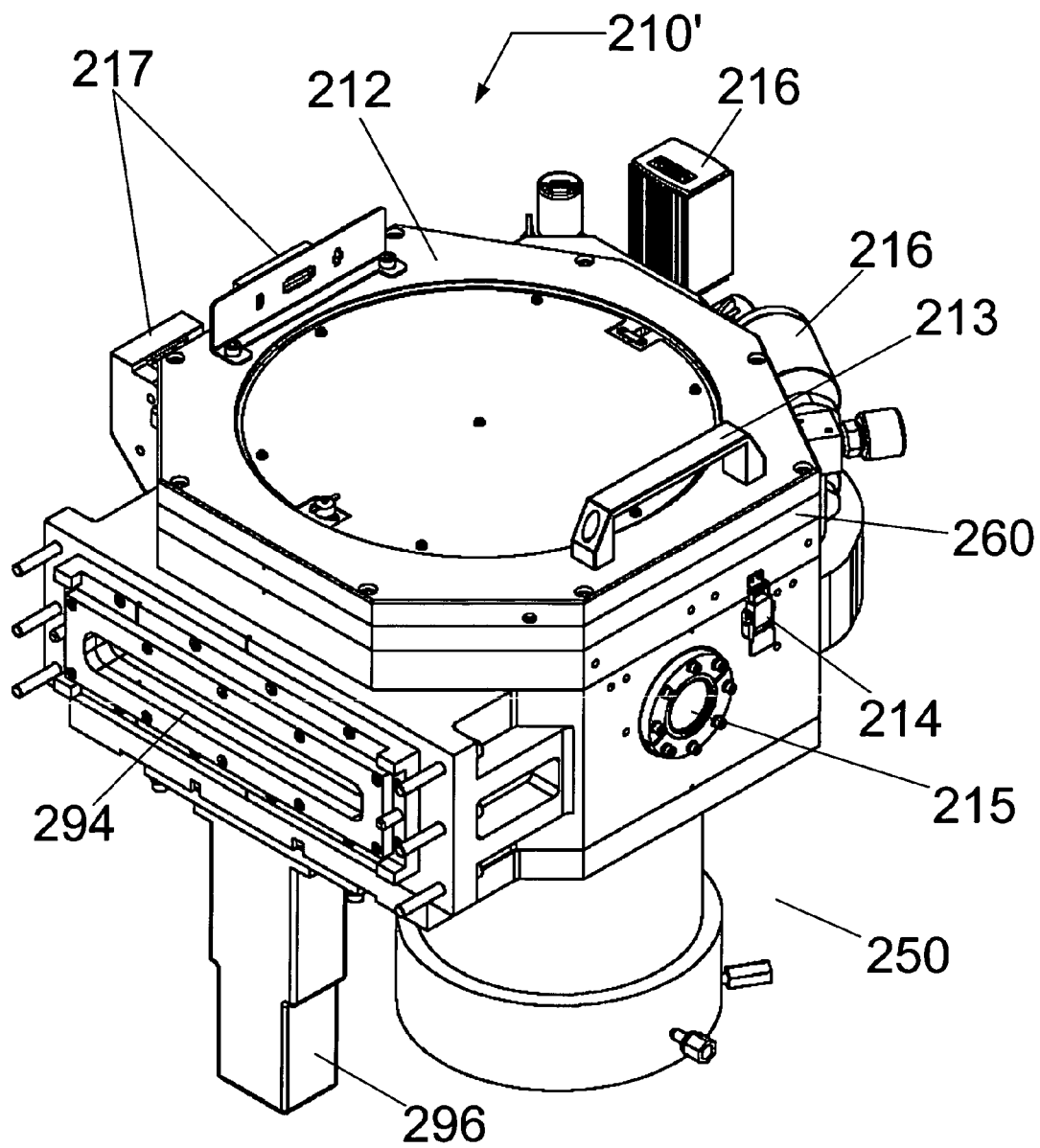
FIG. 4 shows a perspective view of a chemical treatment system according to another embodiment of the present invention.

In one example, FIG. 4 presents a chemical treatment system 210' further comprising a lid 212 with a handle 213, at least one clasp 214, and at least one hinge 217, an optical viewport 215, and at least one pressure sensing device 216.

As described in FIGS. 2 and 5, the thermal treatment system 220 further comprises a temperature controlled substrate holder 270. The substrate holder 270 comprises a pedestal 272 thermally insulated from the thermal treatment chamber 221 using a thermal barrier 274. For example, the substrate holder 270 can be fabricated from aluminum, stainless steel, or nickel, and the thermal barrier 274 can be fabricated from a thermal insulator such as Teflon, alumina, or quartz. The substrate holder 270 further comprises a heating element 276 embedded therein and a substrate holder temperature control unit 278 coupled thereto. The heating element 276 can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, and Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the substrate holder temperature control unit 278 can, for example, comprise a controllable DC power supply. Alternately, the temperature controlled substrate holder 270 can, for example, be a cast-in heater commercially available from Watlow (1310 Kingsland Dr., Batavia, Ill., 60510) capable of a maximum operating temperature of about 400° to about 450° C., or a film heater comprising aluminum nitride materials that is also commercially available from Watlow and capable of operating temperatures as high as about 300° C. and power densities of up to about 23.25 W/cm$^2$. Alternatively, a cooling element can be incorporated in substrate holder 270.

The temperature of the substrate holder 270 can be monitored using a temperature-sensing device such as a thermocouple (e.g. a K-type thermocouple). Furthermore, a controller can utilize the temperature measurement as feedback to the substrate holder temperature control unit 278 in order to control the temperature of the substrate holder 270.

Additionally, the substrate temperature can be monitored using a temperature-sensing device such as an optical fiber thermometer commercially available from Advanced Energies, Inc. (1625 Sharp Point Drive, Fort Collins, Colo., 80525), Model No. OR2000F capable of measurements from about 50° to about 2000° C. and an accuracy of about plus or minus 1.5° C., or a band-edge temperature measurement system as described in pending U.S. patent application Ser. No. 10/168544, filed on Jul. 2, 2002, the contents of which are incorporated herein by reference in their entirety.

Referring again to FIG. 5, thermal treatment system 220 further comprises a temperature controlled thermal treatment chamber 221 that is maintained at a selected temperature. For example, a thermal wall heating element 283 can be coupled to a thermal wall temperature control unit 281, and the thermal wall heating element 283 can be configured to couple to the thermal treatment chamber 221. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the thermal wall temperature control unit 281 can, for example, comprise a controllable DC power supply. For example, thermal wall heating element 283 can comprise at least one Firerod cartridge heater commercially available from Watlow (1310 Kingsland Dr., Batavia, Ill., 60510). Alternatively, or in addition, cooling elements may be employed in thermal treatment chamber 221. The temperature of the thermal treatment chamber 221 can be monitored using a temperature-sensing device such as a thermocouple (e.g. a K-type thermocouple, Pt sensor, etc.). Furthermore, a controller can utilize the temperature measurement as feedback to the thermal wall temperature control unit 281 in order to control the temperature of the thermal treatment chamber 221.

Referring still to FIGS. 2 and 5, thermal treatment system 220 further comprises an upper assembly 284. The upper assembly 284 can, for example, comprise a gas injection system for introducing a purge gas, process gas, or cleaning gas to the thermal treatment chamber 221. Alternately, thermal treatment chamber 221 can comprise a gas injection system separate from the upper assembly. For example, a purge gas, process gas, or cleaning gas can be introduced to the thermal treatment chamber 221 through a side-wall thereof. It can further comprise a cover or lid having at least one hinge, a handle, and a clasp for latching the lid in a closed position. In an alternate embodiment, the upper assembly 284 can comprise a radiant heater such as an array of tungsten halogen lamps for heating substrate 242" resting atop blade 500 (see FIG. 11) of substrate lifter assembly 290. In this case, the substrate holder 270 could be excluded from the thermal treatment chamber 221.

Referring again to FIG. 5, thermal treatment system 220 can further comprise a temperature controlled upper assembly 284 that can be maintained at a selected temperature. For example, an upper assembly 285 can be coupled to an upper assembly temperature control unit 286, and the upper assembly heating element 285 can be configured to couple to the upper assembly 284. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the upper assembly temperature control unit 286 can, for example, comprise a controllable DC power supply. For example, upper assembly heating element 267 can comprise a dual-zone silicone rubber heater (about 1.0 mm thick) capable of about 1400 W (or power density of about 5 W/in$^2$). The temperature of the upper assembly 284 can be monitored using a temperature-sensing device such as a thermocouple (e.g. a K-type thermocouple, Pt sensor, etc.). Furthermore, a controller can utilize the temperature measurement as feedback to the upper assembly temperature control unit 286 in order to control the temperature of the upper assembly 284. Upper assembly 284 may additionally or alternatively include a cooling element.

Figure 11:
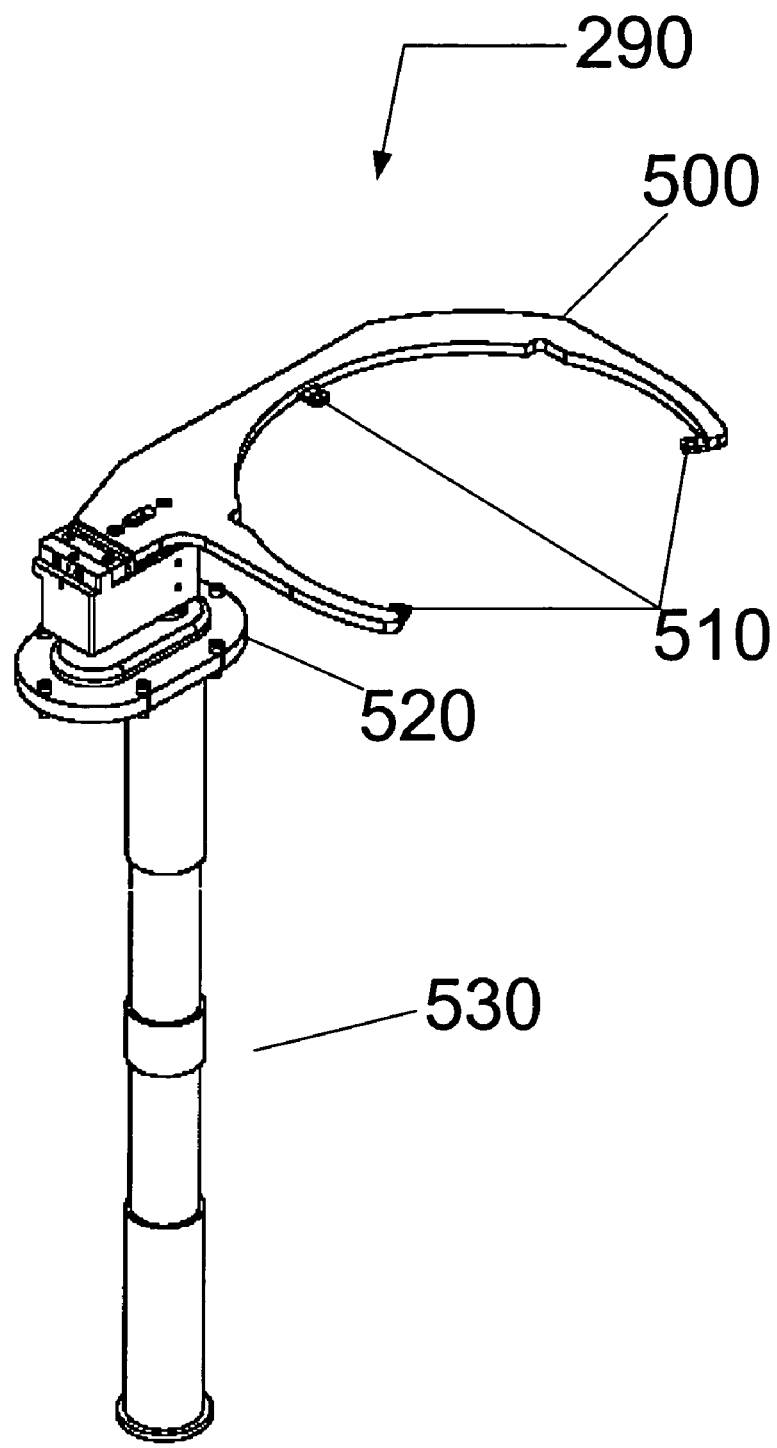
FIG. 11 shows a substrate lifter assembly according to an embodiment of the present invention.

Referring again to FIGS. 2 and 5, thermal treatment system 220 further comprises a substrate lifter assembly 290. The substrate lifter assembly 290 is configured to lower a substrate 242' to an upper surface of the substrate holder 270, as well as raise a substrate 242" from an upper surface of the substrate holder 270 to a holding plane, or a transfer plane therebetween. At the transfer plane, substrate 242" can be exchanged with a transfer system utilized to transfer substrates into and out of the chemical and thermal treatment chambers 211, 221. At the holding plane, substrate 242" can be cooled while another substrate is exchanged between the transfer system and the chemical and thermal treatment chambers 211, 221. As shown in FIG. 11, the substrate lifter assembly 290 comprises a blade 500 having three or more tabs 510, a flange 520 for coupling the substrate lifter assembly 290 to the thermal treatment chamber 221, and a drive system 530 for permitting vertical translation of the blade 500 within the thermal treatment chamber 221. The tabs 510 are configured to grasp substrate 242" in a raised position, and to recess within receiving cavities 540 formed within the substrate holder 270 (see FIG. 5) when in a lowered position. The drive system 530 can, for example, be a pneumatic drive system designed to meet various specifications including cylinder stroke length, cylinder stroke speed, position accuracy, non-rotation accuracy, etc., the design of which is known to those skilled in the art of pneumatic drive system design.

Referring still to FIGS. 2 and 5, thermal treatment system 220 further comprises a vacuum pumping system 280. Vacuum pumping system 280 can, for example, comprise a vacuum pump, and a throttle valve such as a gate valve or butterfly valve. The vacuum pump can, for example, include a turbo-molecular vacuum pump (TMP) capable of a pumping speed up to about 5000 liters per second (and greater). TMPs are useful for low pressure processing, typically less than about 50 mTorr. For high pressure processing (i.e., greater than about 100 mTorr), a mechanical booster pump and dry roughing pump can be used.

Referring again to FIG. 5, thermal treatment system 220 can further comprise a controller 275 having a microprocessor, memory, and a digital I/O port capable of generating control voltages sufficient to communicate and activate inputs to thermal treatment system 220 as well as monitor outputs from thermal treatment system 220. Moreover, controller 275 can be coupled to and can exchange information with substrate holder temperature control unit 278, upper assembly temperature control unit 286, upper assembly 284, thermal wall temperature control unit 281, vacuum pumping system 280, and substrate lifter assembly 290. For example, a program stored in the memory can be utilized to activate the inputs to the aforementioned components of thermal treatment system 220 according to a process recipe. One example of controller 275 is a DELL PRECISION WORKSTATION 610™, available from Dell Corporation, Austin, Tex.

In an alternate embodiment, controllers 235 and 275 can be the same controller.

Figure 6:
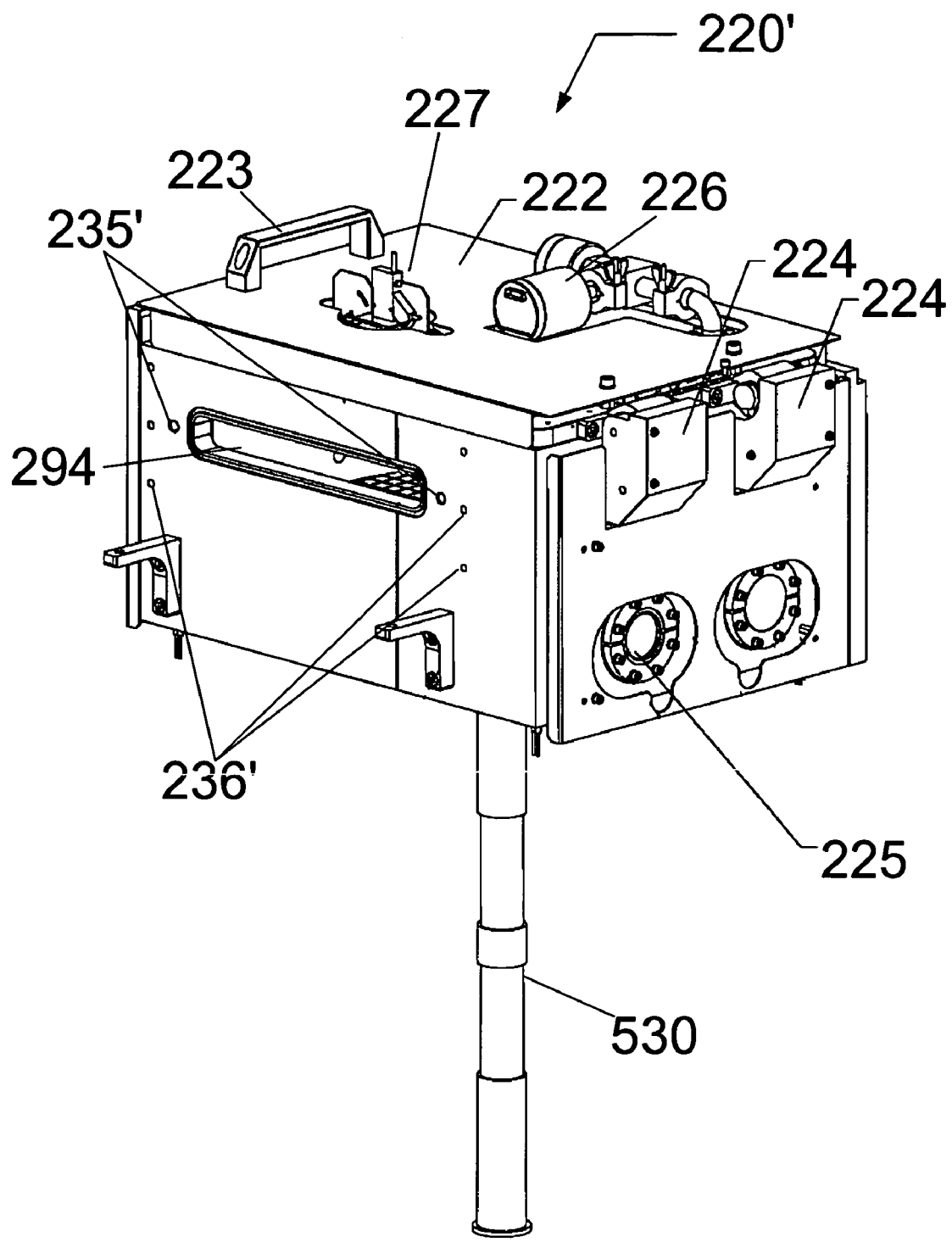
FIG. 6 shows a perspective view of a thermal treatment system according to another embodiment of the present invention.

In one example, FIG. 6 presents a thermal treatment system 220' further comprising a lid 222 with a handle 223 and at least one hinge 224, an optical viewport 225, and at least one pressure sensing device 226. Additionally, the thermal treatment system 220' further comprises a substrate detection system 227 in order to identify whether a substrate is located in the holding plane. The substrate detection system can, for example, comprise a Keyence digital laser sensor.

Figure 12:
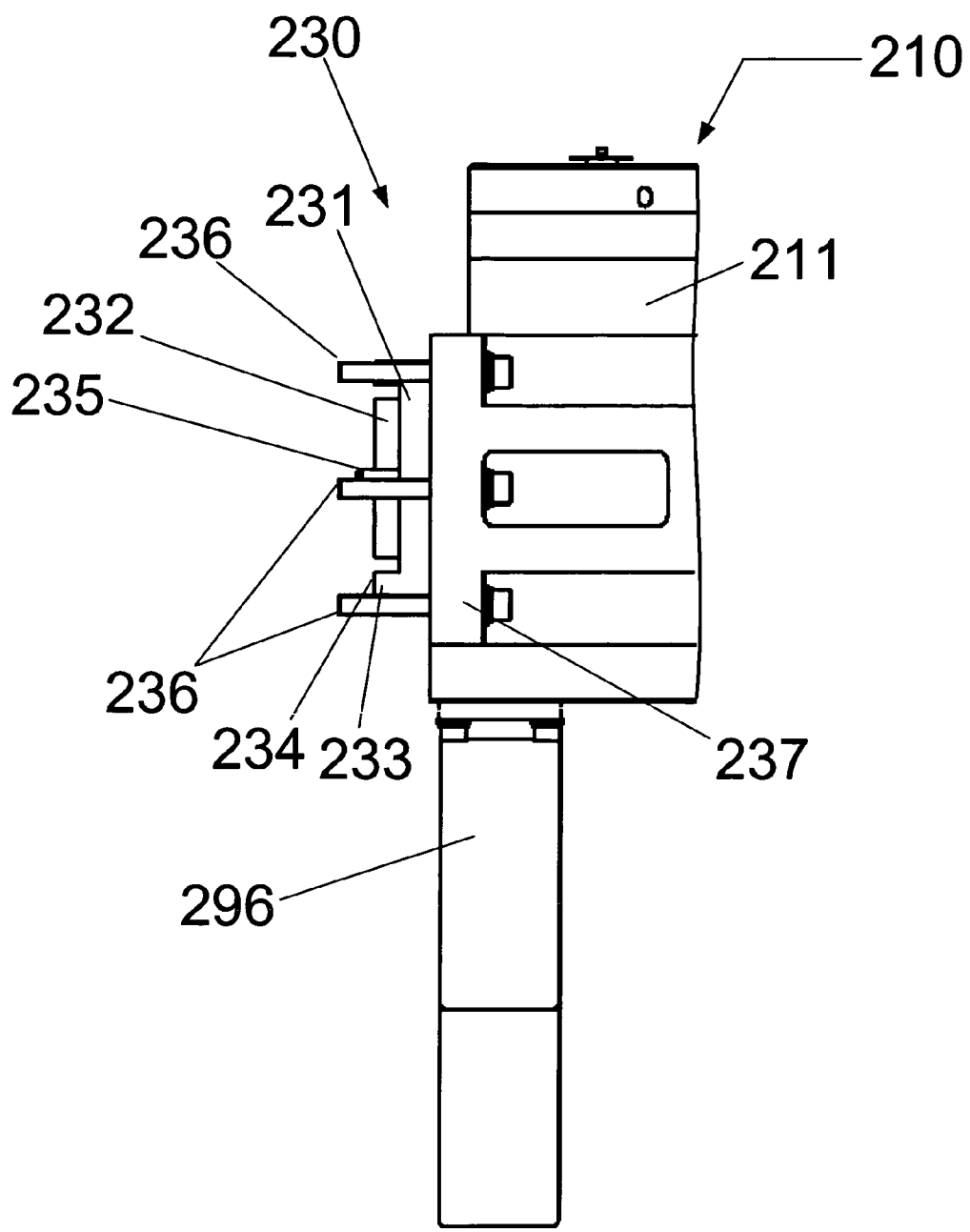
FIG. 12 shows a side view of a thermal insulation assembly according to an embodiment of the present invention.
Figure 13:
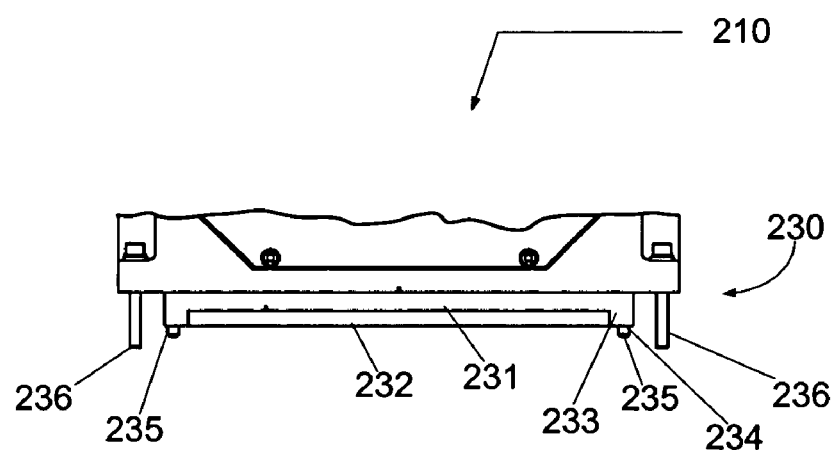
FIG. 13 shows a top view of a thermal insulation assembly according to an embodiment of the present invention.
Figure 14:
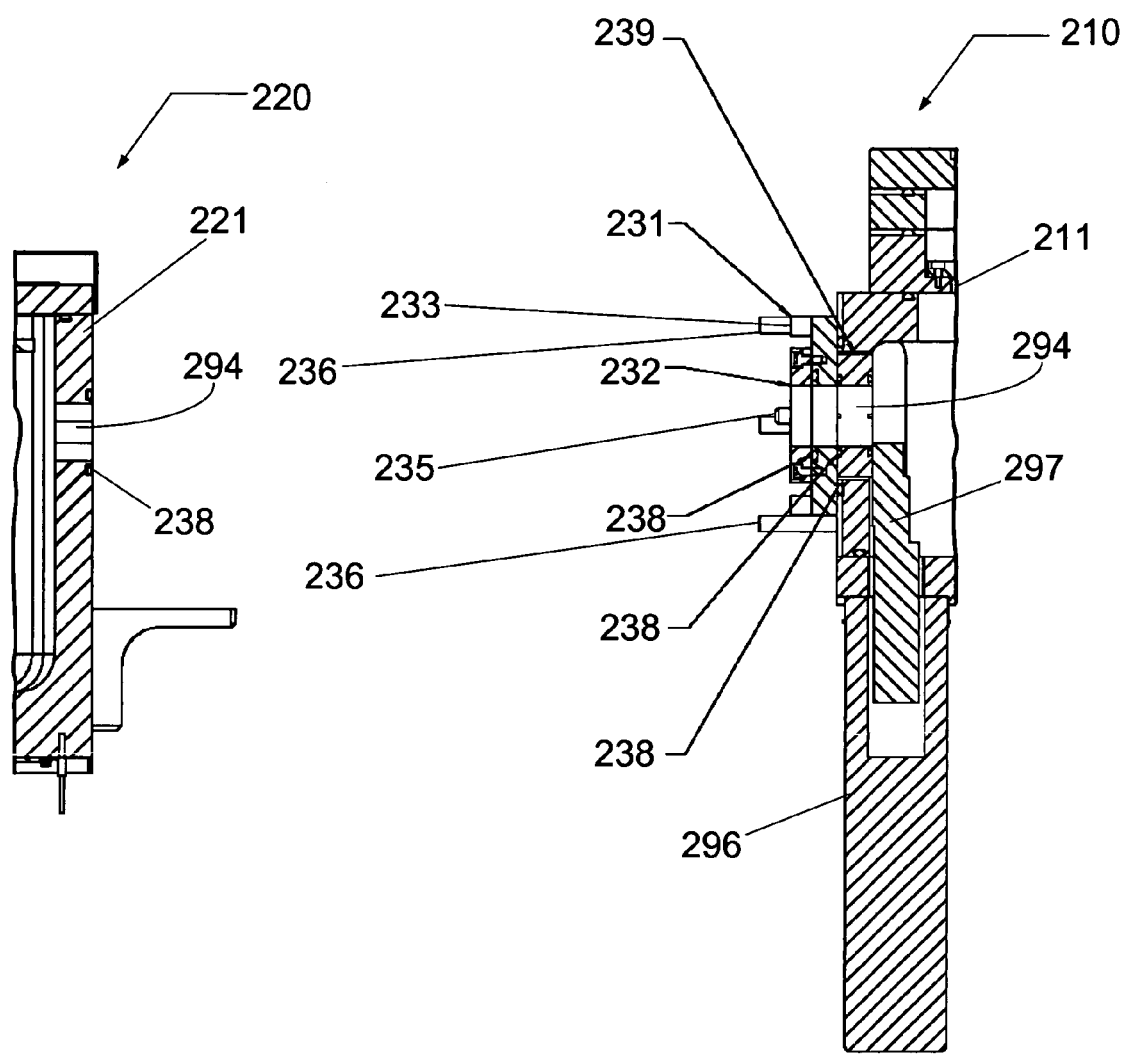
FIG. 14 shows a cross-sectional side view of a thermal insulation assembly according to an embodiment of the present invention.

FIGS. 12, 13, and 14 depict a side view, a top view, and a side cross-sectional view, respectively, of thermal insulation assembly 230. A similar assembly can also be used as thermal insulation assembly 50, 150 or 650. The thermal insulation assembly 230 can comprise an interface plate 231 coupled to, for example, the chemical treatment chamber 211, as shown in FIG. 12, and configured to form a structural contact between the thermal treatment chamber 221 (see FIG. 14) and the chemical treatment chamber 211, and an insulator plate 232 coupled to the interface plate 231 and configured to reduce the thermal contact between the thermal treatment chamber 221 and the chemical treatment chamber 211. Furthermore, in FIG. 12, the interface plate 231 comprises one or more structural contact members 233 having a mating surface 234 configured to couple with a mating surface on the thermal treatment chamber 221. The interface plate 231 can be fabricated from a metal, such as aluminum, stainless steel, etc., in order to form a rigid contact between the two chambers 211, 221. The insulator plate 232 can be fabricated from a material having a low thermal conductivity such as Teflon, alumina, quartz, etc. A thermal insulation assembly is described in greater detail in pending U.S. application Ser. No. 10/705,397, filed on Nov. 12, 2003 and entitled, "Method and Apparatus For Thermally Insulating Adjacent Temperature Controlled Chambers", and it is incorporated by reference in its entirety.

As illustrated in FIGS. 2 and 14, gate valve assembly 297 is utilized to vertically translate a gate valve 297 in order to open and close the common opening 294. The gate valve assembly 296 can further comprise a gate valve adaptor plate 239 that provides a vacuum seal with the interface plate 231 and provides a seal with the gate valve 297.

The two chambers 211, 221 can be coupled to one another using one or more alignment devices 235 and terminating in one or more alignment receptors 235', as in FIG. 6, and one or more fastening devices 236 (i.e. bolts) extending through a flange 237 on the first chamber (e.g. chemical treatment chamber 211) and terminating within one or more receiving devices 236', as in FIG. 6, (i.e. tapped hole) in the second chamber (e.g. thermal treatment chamber 221). As shown in FIG. 14, a vacuum seal can be formed between the insulator plate 232, the interface plate 231, the gate adaptor plate 239, and the chemical treatment chamber 211 using, for example, elastomer O-ring seals 238, and a vacuum seal can be formed between the interface plate 232 and the thermal treatment chamber 221 via O-ring seal 238.

Furthermore, one or more surfaces of the components comprising the chemical treatment chamber 211 and the thermal treatment chamber 221 can be coated with a protective barrier. The protective barrier can comprise at least one of Kapton, Teflon, surface anodization, ceramic spray coating such as alumina, yttria, etc., plasma electrolytic oxidation, etc.

Figure 15:
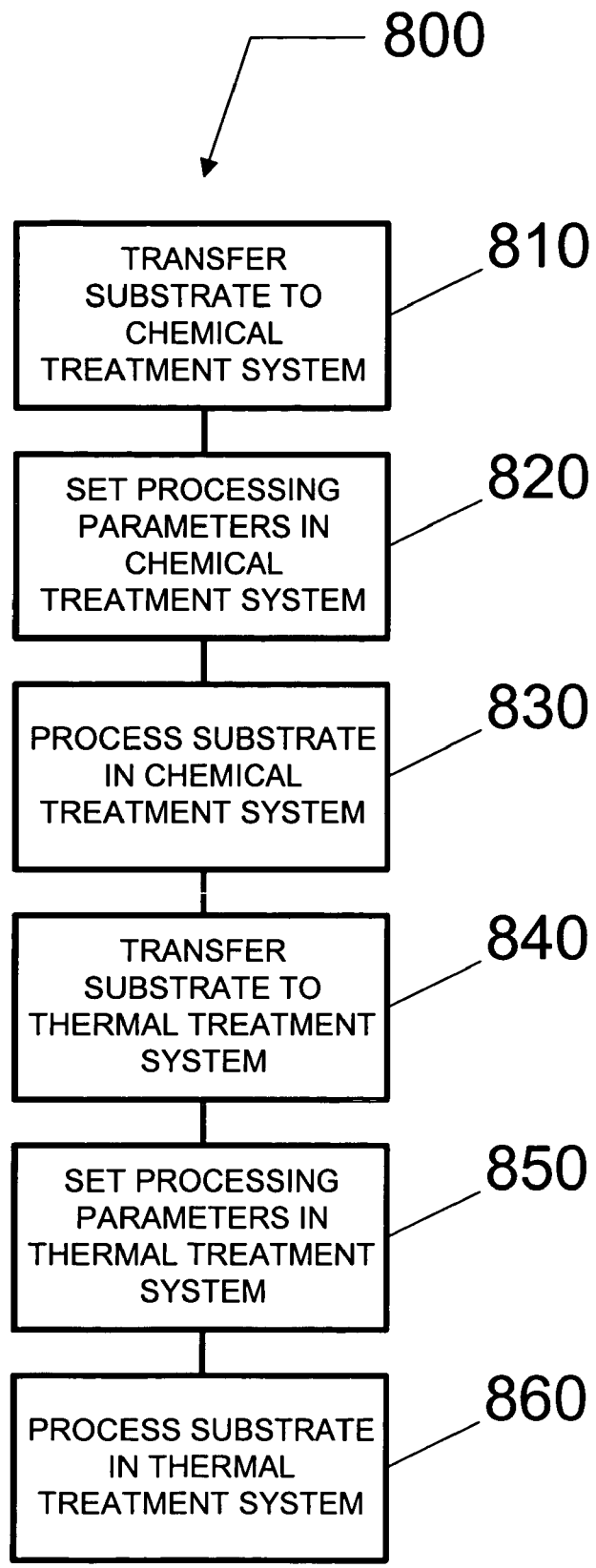
FIG. 15 shows a flow diagram for processing a substrate.

FIG. 15 presents a method of operating the processing system 200 comprising chemical treatment system 210 and thermal treatment system 220. The method is illustrated as a flowchart 800 beginning with step 810 wherein a substrate is transferred to the chemical treatment system 210 using the substrate transfer system. The substrate is received by lift pins that are housed within the substrate holder, and the substrate is lowered to the substrate holder. Thereafter, the substrate is secured to the substrate holder using a clamping system, such as an electrostatic clamping system, and a heat transfer gas is supplied to the backside of the substrate.

In step 820, one or more chemical processing parameters for chemical treatment of the substrate are set. For example, the one or more chemical processing parameters comprise at least one of a chemical treatment processing pressure, a chemical treatment wall temperature, a chemical treatment substrate holder temperature, a chemical treatment substrate temperature, a chemical treatment gas distribution system temperature, and a chemical treatment gas flow rate. For example, one or more of the following may occur: 1) a controller coupled to a wall temperature control unit and a first temperature-sensing device is utilized to set a chemical treatment chamber temperature for the chemical treatment chamber; 2) a controller coupled to a gas distribution system temperature control unit and a second temperature-sensing device is utilized to set a chemical treatment gas distribution system temperature for the chemical treatment chamber; 3) a controller coupled to at least one temperature control element and a third temperature-sensing device is utilized to set a chemical treatment substrate holder temperature; 4) a controller coupled to at least one of a temperature control element, a backside gas supply system, and a clamping system, and a fourth temperature sensing device in the substrate holder is utilized to set a chemical treatment substrate temperature; 5) a controller coupled to at least one of a vacuum pumping system, and a gas distribution system, and a pressure-sensing device is utilized to set a processing pressure within the chemical treatment chamber; and/or 6) the mass flow rates of the one or more process gases are set by a controller coupled to the one or more mass flow controllers within the gas distribution system.

In step 830, the substrate is chemically treated under the conditions set forth in step 820 for a first period of time. The first period of time can range from about 10 to about 480 seconds, for example.

In step 840, the substrate is transferred from the chemical treatment chamber to the thermal treatment chamber. During which time, the substrate clamp is removed, and the flow of heat transfer gas to the backside of the substrate is terminated. The substrate is vertically lifted from the substrate holder to the transfer plane using the lift pin assembly housed within the substrate holder. The transfer system receives the substrate from the lift pins and positions the substrate Within the thermal treatment system. Therein, the substrate lifter assembly receives the substrate from the transfer system, and lowers the substrate to the substrate holder.

In step 850, thermal processing parameters for thermal treatment of the substrate are set. For example, the one or more thermal processing parameters comprise at least one of a thermal treatment wall temperature, a thermal treatment upper assembly temperature, a thermal treatment substrate temperature, a thermal treatment substrate holder temperature, a thermal treatment substrate temperature, and a thermal treatment processing pressure. For example, one or more of the following may occur: 1) a controller coupled to a thermal wall temperature control unit and a first temperature-sensing device in the thermal treatment chamber is utilized to set a thermal treatment wall temperature; 2) a controller coupled to an upper assembly temperature control unit and a second temperature-sensing device in the upper assembly is utilized to set a thermal treatment upper assembly temperature; 3) a controller coupled to a substrate holder temperature control unit and a third temperature-sensing device in the heated substrate holder is utilized to set a thermal treatment substrate holder temperature; 4) a controller coupled to a substrate holder temperature control unit and a fourth temperature-sensing device in the heated substrate holder and coupled to the substrate is utilized to set a thermal treatment substrate temperature; and/or 5) a controller coupled to a vacuum pumping system, a gas distribution system, and a pressure sensing device is utilized to set a thermal treatment processing pressure within the thermal treatment chamber.

In step 860, the substrate is thermally treated under the conditions set forth in step 850 for a second period of time. The second period of time can range from about 10 to about 480 seconds, for example.

In an example, the processing system 200, as depicted in FIG. 2, can be a chemical oxide removal system for trimming an oxide hard mask. The processing system 200 comprises chemical treatment system 210 for chemically treating exposed surface layers, such as oxide surface layers, on a substrate, whereby adsorption of the process chemistry on the exposed surfaces affects chemical alteration of the surface layers. Additionally, the processing system 200 comprises thermal treatment system 220 for thermally treating the substrate, whereby the substrate temperature is elevated in order to desorb (or evaporate) the chemically altered exposed surface layers on the substrate.

In the chemical treatment system 210, the process space 262 (see FIG. 2) is evacuated, and a process gas comprising HF and $NH_3$ is introduced. Alternately, the process gas can further comprise a carrier gas. The carrier gas can, for example, comprise an inert gas such as argon, xenon, helium, etc. The processing pressure can range from about 1 to about 100 mTorr. Alternatively, the processing pressure can range from about 2 to about 25 mTorr. The process gas flow rates can range from about 1 to about 200 sccm for each specie. Alternatively, the flow rates can range from about 10 to about 100 sccm. Although the vacuum pumping system 250 is shown in FIGS. 2 and 3 to access the chemical treatment chamber 211 from the side, a uniform (three-dimensional) pressure field can be achieved. Table I illustrates the dependence of the pressure uniformity at the substrate surface as a function of processing pressure and the spacing between the gas distribution system 260 and the upper surface of substrate 242.

TABLE I

| (%) | h (spacing) | | | | |
|---|---|---|---|---|---|
| Pressure | 50 mm | 62 | 75 | 100 | 200 |
| 20 mTorr | 0.6 | NA | NA | NA | NA |
| 9 | NA | NA | 0.75 | 0.42 | NA |
| 7 | 3.1 | 1.6 | 1.2 | NA | NA |
| 4 | 5.9 | 2.8 | NA | NA | NA |
| 3 | NA | 3.5 | 3.1 | 1.7 | 0.33 |

Additionally, the chemical treatment chamber 211 can be heated to a temperature ranging from about 10° to about 200° C. Alternatively, the chamber temperature can range from about 35° to about 55° C. Additionally, the gas distribution system can be heated to a temperature ranging from about 10° to about 200° C. alternatively, the gas distribution system temperature can range from about 40° to about 60° C. The substrate can be maintained at a temperature ranging from about 10° to about 50° C. Alternatively, the substrate temperature can range from about 25° to about 30° C.

In the thermal treatment system 220, the thermal treatment chamber 221 can be heated to a temperature ranging from about 20° to about 100° C. Alternatively, the temperature can range from about 75° to about 100° C. Additionally, the upper assembly can be heated to a temperature ranging from about 20° to about 200° C. Alternatively, the upper assembly temperature can range from about 75° to about 100° C. The substrate can be heated to a temperature in excess of about 100° C., for example, from about 100° to about 200° C. Alternatively, the substrate temperature can range from about 100° to about 150° C.

The chemical treatment and thermal treatment described herein can produce an etch amount of an exposed oxide surface layer in excess of about 10 nm per 60 seconds of chemical treatment for thermal oxide, an etch amount of the exposed oxide surface layer in excess of about 25 nm per 180 seconds of chemical treatment for thermal oxide, and an etch amount of the exposed oxide surface layer in excess of about 10 nm per 180 seconds of chemical treatment for ozone TEOS. The treatments can also produce an etch variation across said substrate of less than about 2.5%.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A processing system for thermally treating a substrate comprising:

a temperature controlled thermal treatment chamber;

a temperature controlled substrate holder mounted within said thermal treatment chamber and configured to be substantially thermally insulated from said thermal treatment chamber, wherein said heated substrate holder includes a mechanism to elevate a thermal treatment substrate temperature of said substrate in order to thermally treat chemically altered exposed surface layers thereon;

a transfer system coupled to the temperature controlled thermal treatment chamber to transfer substrates into and out of the temperature controlled thermal treatment chamber;

a substrate lifter assembly coupled to said temperature controlled thermal treatment chamber for vertically translating said substrate between a transfer plane and said temperature controlled substrate holder;

a vacuum pumping system coupled to said thermal treatment chamber and configured to evacuate gaseous products of said thermal treatment; and a substrate detection system to detect a presence of said substrate on said substrate lifter assembly.

2. The processing system as recited in claim 1 further comprising a controller coupled to at least one of said temperature controlled thermal treatment chamber, said heated substrate holder, said substrate lifter assembly, and said vacuum pumping system, and configured to at least one of set, monitor, and adjust at least one of a thermal treatment chamber temperature, a thermal treatment substrate holder temperature, a thermal treatment substrate temperature, and a thermal treatment processing pressure.

3. The processing system as recited in claim 1, wherein said thermal treatment system is coupled to another processing system.

4. The processing system as recited in claim 1, wherein said thermal treatment system is coupled to a chemical treatment system.

5. The processing system as recited in claim 1, wherein said heated substrate holder comprises at least one of thin film heater, a cast-in heater, a resistive element, a heating channel, a radiant lamp, and a thermo-electric device.

6. The processing system as recited in claim 1, wherein said temperature controlled thermal treatment chamber comprises at least one of a cooling channel, a heating channel, a resistive heating element, a radiant lamp, and a thermo-electric device.

7. The processing system as recited in claim 1, wherein said substrate lifter assembly comprises a blade for transferring said substrate, and a drive system for vertically translating said substrate between said heated substrate holder and said transfer plane.

8. The processing system as recited in claim 7, wherein said blade comprises three or more tabs for receiving said substrate.

9. The processing system as recited in claim 1, wherein said thermal processing system further comprises an upper assembly.

10. The processing system as recited in claim 9, wherein said upper assembly is temperature controlled.

11. The processing system of claim 9, wherein said upper assembly is configured to introduce a purge gas to said thermal treatment chamber.

12. A method of operating a processing system to thermally treat a substrate comprising:
transferring, via a transfer system, said substrate into a thermal treatment system comprising a thermal treatment chamber, a temperature controlled substrate holder mounted within said thermal treatment chamber and configured to be substantially thermally insulated from said thermal treatment chamber, a substrate lifter assembly coupled to said temperature controlled thermal treatment chamber for vertically translating said substrate between a transfer plane and said temperature controlled substrate holder, a vacuum pumping system, a substrate detection system, and a controller coupled to said thermal treatment system;
setting thermal processing parameters for said thermal treatment system using said controller, wherein said one or more thermal processing parameters comprise at least one of a thermal treatment processing pressure, a thermal treatment chamber temperature, a thermal treatment substrate temperature, and a thermal treatment substrate holder temperature;
processing said substrate in said thermal treatment system using said thermal processing parameters in order to evaporate chemically altered exposed surface layers on said substrate;
vertically translating, via said substrate lifter assembly, said substrate between a transfer plane and said temperature controlled substrate holder; and
detecting a presence of said substrate on said substrate lifter assembly using said substrate detection system.

13. The method as recited in claim 12, wherein said heated substrate holder comprises at least one of thin film heater, a cast-in heater, a resistive element, a heating channel, a radiant lamp, and a thermo-electric device.

14. The method as recited in claim 12, wherein said temperature controlled thermal treatment chamber comprises at least one of a cooling channel, a heating channel, a resistive heating element, a radiant lamp, and a thermo-electric device.

15. The method as recited in claim 12, wherein said substrate lifter assembly comprises a blade for transferring said substrate, and a drive system for vertically translating said substrate between said heated substrate holder and said transfer plane.

16. The method as recited in claim 15, wherein said blade comprises three or more tabs for receiving said substrate.

17. The method as recited in claim 12, wherein said setting a thermal treatment chamber temperature includes heating said thermal treatment chamber using a thermal wall temperature control unit coupled to said thermal treatment chamber and monitoring said thermal treatment chamber temperature.

18. The method as recited in claim 17, wherein said thermal treatment chamber temperature ranges from about 20° to about 200° C.

19. The method as recited in claim 12, wherein said setting a thermal treatment substrate holder temperature by adjusting a substrate heating assembly coupled to said temperature controlled substrate holder and monitoring said thermal treatment substrate holder temperature.

20. The method as recited in claim 19, wherein said thermal treatment substrate holder temperature exceeds about 100° C.

21. The method as recited in claim 12, wherein said setting a thermal treatment substrate temperature includes adjusting a substrate heating assembly coupled to said temperature controlled substrate holder and monitoring said thermal treatment substrate temperature.

22. The method as recited in claim 21, wherein said thermal treatment substrate temperature ranges from about 100° C. to about 200° C.

23. The method as recited in claim 12, wherein said thermal treatment chamber further comprises an upper assembly.

24. The method as recited in claim 23, wherein said one or more thermal processing parameters further comprise a thermal treatment upper assembly temperature.

25. The method as recited in claim 24, wherein said setting a thermal treatment upper assembly temperature includes using an upper assembly temperature control unit coupled to said upper assembly and monitoring said thermal treatment upper assembly temperature.

26. The method as recited in claim 25, wherein said thermal treatment upper assembly temperature ranges from about 20° C. to about 200° C.

27. The method as recited in claim 12, wherein said thermal treatment system further comprise means for introducing a gas to said thermal treatment system and control a gas flow rate.

28. The method as recited in claim 12, wherein said thermal treatment system includes an upper assembly which performs at least one of introducing a purge gas to said thermal treatment chamber and detecting a presence of said substrate on said substrate lifter assembly.

* * * * *